(12) United States Patent
Kinoshita

(10) Patent No.: US 11,546,988 B2
(45) Date of Patent: Jan. 3, 2023

(54) DISPLAY DEVICE AND PRINTED CIRCUIT BOARD

(71) Applicant: Japan Display Inc., Tokyo (JP)

(72) Inventor: Kohei Kinoshita, Tokyo (JP)

(73) Assignee: Japan Display Inc., Tokyo (JP)

( * ) Notice: Subject to any disclaimer, the term of this patent is extended or adjusted under 35 U.S.C. 154(b) by 398 days.

(21) Appl. No.: 16/777,309

(22) Filed: Jan. 30, 2020

(65) Prior Publication Data

US 2020/0253049 A1 Aug. 6, 2020

(30) Foreign Application Priority Data

Feb. 1, 2019 (JP) .............................. JP2019-017473

(51) Int. Cl.
*H05K 1/11* (2006.01)
*H05K 7/06* (2006.01)
(Continued)

(52) U.S. Cl.
CPC ........... *H05K 1/11* (2013.01); *G02F 1/13452* (2013.01); *G02F 1/133308* (2013.01);
(Continued)

(58) Field of Classification Search
CPC .......... H05K 1/11; H05K 1/114; H05K 1/183; H05K 1/0215; H05K 1/0216;
(Continued)

(56) References Cited

U.S. PATENT DOCUMENTS 6,229,695 B1 * 5/2001 Moon .................... G06F 1/1658
345/905
2006/0016618 A1 * 1/2006 Kim ....................... H05K 1/114
174/262
(Continued)

FOREIGN PATENT DOCUMENTS

| JP | 2000-022379 | 2/2000 |
| JP | 2000-171815 A | 6/2000 |
| JP | 2001-068863 | 3/2001 |

OTHER PUBLICATIONS

Japanese Office Action dated Oct. 4, 2022 in corresponding Japanese Application No. 2019-017473.

*Primary Examiner* — Xiaoliang Chen
(74) *Attorney, Agent, or Firm* — K&L Gates LLP

(57) ABSTRACT

A display device includes a display panel, a printed circuit board attached to the display panel and including a ground potential supply terminal, a circuit, and a wiring pattern electrically coupling the ground potential supply terminal and the circuit, and a housing that contacts a coupling place provided to the wiring pattern and is attached to the printed circuit board through the coupling place. The wiring pattern includes a terminal wiring pattern electrically coupled with the ground potential supply terminal, a circuit wiring pattern branched from a branch part at a predetermined position on the terminal wiring pattern and electrically coupled with the circuit, and a housing wiring pattern branched from the branch part of the terminal wiring pattern and electrically coupled with the coupling place, and the circuit wiring (Continued)

pattern and the housing wiring pattern are uncoupled with each other at any place other than the branch part.

7 Claims, 9 Drawing Sheets

(51) Int. Cl.
| | |
|---|---|
| *G02F 1/1333* | (2006.01) |
| *G02F 1/1345* | (2006.01) |
| *H01L 21/02* | (2006.01) |
| *H01L 21/22* | (2006.01) |
| *H01L 21/74* | (2006.01) |
| *H05K 5/00* | (2006.01) |
| *H05K 5/02* | (2006.01) |
| *H05K 9/00* | (2006.01) |
| *H05K 1/02* | (2006.01) |

(52) U.S. Cl.
CPC ......... *H05K 1/0215* (2013.01); *H05K 1/0216* (2013.01); *H05K 5/0017* (2013.01); *H05K 5/0247* (2013.01); *H05K 9/0033* (2013.01); *G02F 1/133334* (2021.01); *H05K 5/0008* (2013.01); *H05K 9/0024* (2013.01); *H05K 2201/09254* (2013.01); *H05K 2201/10136* (2013.01); *H05K 2201/10371* (2013.01); *H05K 2201/10409* (2013.01)

(58) Field of Classification Search
CPC .. H05K 5/0008; H05K 5/0017; H05K 5/0247; H05K 7/06; H05K 9/0033; G02F 1/16; G02F 1/1333; G02F 1/1345; G02F 1/1626; G02F 1/1658; G02F 1/13452; G02F 1/133308; G02F 1/133334; G02F 3/041; G02F 3/044; G02F 3/04164; G02F 3/0045; H01L 21/02; H01L 21/22; H01L 21/74; H01L 21/02263
USPC ...... 326/101; 174/255, 261, 262; 361/679.3; 345/179, 905; 349/58
See application file for complete search history.

(56) References Cited

U.S. PATENT DOCUMENTS

| | | | |
|---|---|---|---|
| 2006/0061704 A1* | 3/2006 | Hayano | G02F 1/133308 349/58 |
| 2018/0032204 A1* | 2/2018 | Imazeki | G06F 3/04164 |
| 2018/0033617 A1* | 2/2018 | Imazeki | H01L 21/22 |

* cited by examiner

PRESENT EMBODIMENT

DISPLAY DEVICE AND PRINTED CIRCUIT BOARD

CROSS-REFERENCE TO RELATED APPLICATIONS

This application claims priority from Japanese Application No. 2019-017473, filed on Feb. 1, 2019, the contents of which are incorporated by reference herein in its entirety.

BACKGROUND

1. Technical Field

The present disclosure relates to a display device and a printed circuit board.

2. Description of the Related Art

In an electronic apparatus such as a display device, a metallic cover is used to shield an electronic component mounted on a printed circuit board as disclosed in, for example, Japanese Patent Application Laid-open Publication No. 2000-171815 A. This cover contacts a ground pattern of the printed circuit board for attachment to the electronic component. The ground pattern is a wiring pattern coupled with a circuit on the printed circuit board, and is a pattern for biasing the printed circuit board to ground potential (reference potential).

The cover receives noise from the outside, in other words, electromagnetic waves from the outside in some cases. In such a case, the cover is potentially electrically charged by the electromagnetic wave and flows as current from the cover to the circuit on the printed circuit board through the ground pattern in contact. In this case, for example, the circuit on the printed circuit board potentially malfunctions due to the current from the cover, causing operation defect.

SUMMARY

The present disclosure is intended to solve the above-described problem and provide a display device and a printed circuit board that are capable of preventing operation defect.

A display device according to one embodiment of the present disclosure includes a display panel, a printed circuit board attached to the display panel and including a ground potential supply terminal, a circuit, and a wiring pattern electrically coupling the ground potential supply terminal and the circuit, and a housing that contacts a coupling place provided to the wiring pattern and is attached to the printed circuit board through the coupling place. The wiring pattern includes a terminal wiring pattern electrically coupled with the ground potential supply terminal, a circuit wiring pattern branched from a branch part at a predetermined position on the terminal wiring pattern and electrically coupled with the circuit, and a housing wiring pattern branched from the branch part of the terminal wiring pattern and electrically coupled with the coupling place, and the circuit wiring pattern and the housing wiring pattern are uncoupled with each other at any place other than the branch part.

A printed circuit board according to one embodiment of the present disclosure includes a ground potential supply terminal, a circuit, an opening hole, and a wiring pattern electrically coupling the ground potential supply terminal and the circuit. The wiring pattern includes a terminal wiring pattern electrically coupled with the ground potential supply terminal, a circuit wiring pattern branched from a branch part at a predetermined position on the terminal wiring pattern and electrically coupled with the circuit, and a housing wiring pattern branched from the branch part of the terminal wiring pattern and electrically coupled with a coupling place around the opening hole, and the circuit wiring pattern and the housing wiring pattern are uncoupled with each other at any place other than the branch part.

DETAILED DESCRIPTION

Figure 1:
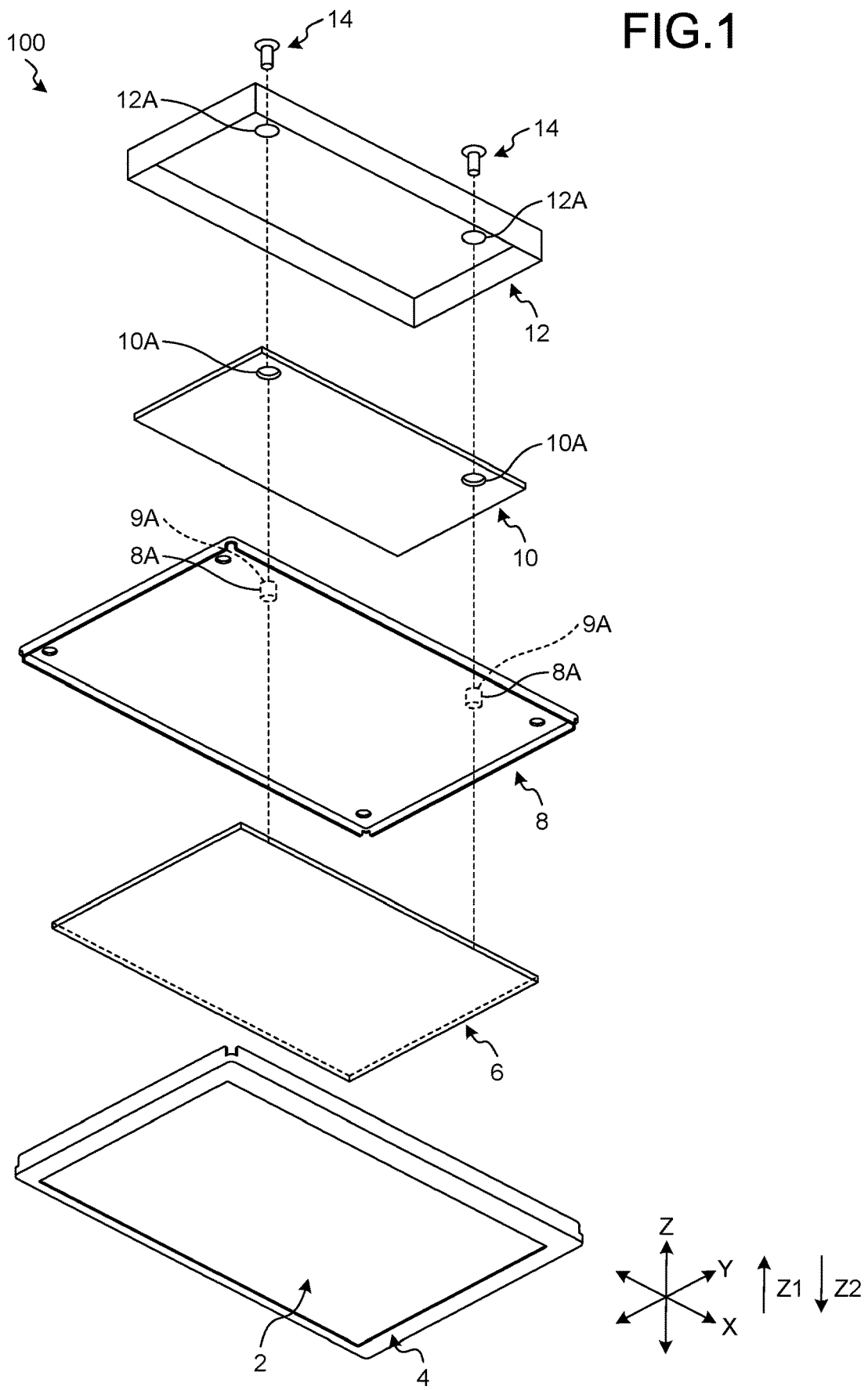
FIG. 1 is an exploded perspective view of a display device according to the present embodiment.

An embodiment of the present disclosure will be described below with reference to the accompanying drawings. The present disclosure is merely exemplary, and any modification that could be easily thought of by the skilled person in the art as appropriate without departing from the gist of the disclosure is included in the scope of the present disclosure. In the drawings, for example, the width, thickness, and shape of each component are schematically illustrated as compared to actual aspects in some cases for clearer description, but are merely exemplary and not intended to limit interpretation of the present disclosure. In the present specification and drawings, any element same as that already described with reference to a drawing already described is denoted by an identical reference sign and detailed description thereof is omitted as appropriate in some cases.

FIG. 1 is an exploded perspective view of a display device according to the present embodiment. This display device 100 is installed on, for example, the dashboard of an automobile and used for navigation display of a car navigation system, music operation screen display, movie playback display, meter display such as speed display, and the like. As illustrated in FIG. 1, the display device 100 includes a display panel 2, a front case 4, a backlight unit 6, a back surface plate 8, a printed circuit board 10, and a shield cover 12.

The display panel 2 is a liquid crystal display panel including two translucent substrates and liquid crystal encapsulated between the two translucent substrates. The display panel 2 displays an image by changing the light transmissivity of each pixel based on an image signal. A direction X is defined to be one direction on the plane of the display panel 2, a direction Y is defined to be a direction orthogonal to the direction X on the plane of the display panel 2, and a direction Z is defined to be a direction orthogonal to the X-Y plane. A direction Z1 is defined to be one direction along the direction Z, and a direction Z2 is defined to be the other direction along the direction Z, in other words, a direction opposite to the direction Z1. In addition, a display surface is defined to be a surface on which the display panel 2 displays an image, and a back surface is defined to be a surface opposite to the display surface of the display panel 2. In this case, the direction Z1 is a direction from the display surface to the back surface, and the direction Z2 is a direction from the back surface to the display surface.

Although not illustrated, the display panel 2 is coupled with one end of a flexible printed circuit (FPC) board. The other end of the FPC board is coupled with the printed circuit board 10 configured to transmit a control signal to the display panel 2 to control display operation. In addition, a protection cover may be disposed on the display side of the display panel 2. The protection cover is a translucent member that covers the display surface of the display panel 2 to protect it. The translucent member may be a glass, a translucent resin member, or a touch panel.

The backlight unit 6 is disposed on the back surface side of the display panel 2, in other words, the direction Z1 side of the display panel 2. The backlight unit 6 emits light toward the display panel 2 so that the light is incident on the entire surface in a display region. The backlight unit 6 includes, for example, a light source, and a light guiding plate configured to guide light output from the light source and emit the light toward the back surface of the display panel 2.

The front case 4 is provided on the direction Z2 side of the display panel 2, and the back surface plate 8 is provided on the direction Z1 side of the backlight unit 6. The front case 4 and the back surface plate 8 are assembled into a housing that houses the display panel 2 and the backlight unit 6 inside. The back surface plate 8 is a conductive member, in this example, a metallic member and is formed by bending a metallic plate member in the present embodiment. In addition, the back surface plate 8 includes, on the back surface as a surface opposite to the display panel 2 (surface on the direction Z1 side), two bosses 8A protruding on the direction Z1 side. Each boss 8A has a coupling hole 9A. The number of bosses 8A is not limited to two but is optional. Only at least one boss 8A and at least one coupling hole 9A need to be provided. In other words, the number of bosses 8A and the number of coupling holes 9A are each two in FIG. 1 but may be each one or may be each three or more.

The printed circuit board 10 is disposed on the back surface side of a back surface plate 5, in other words, the direction Z1 side of back surface plate 5. The printed circuit board 10 is provided with two opening holes 10A penetrating from one surface to the other surface. The number of opening holes 10A is not limited to two but is optional.

The shield cover 12 is disposed on the direction Z1 side of the printed circuit board 10. The shield cover 12 is a component shielding a circuit as an electronic component mounted on the printed circuit board 10. The shield cover 12 is attached to the printed circuit board 10 to cover the printed circuit board 10. The shield cover 12 is a conductive member, in this example, a metallic member and is formed by bending a metallic plate member in the present embodiment. The shield cover 12 is provided with two opening holes 12A penetrating from one surface to the other surface. The number of opening holes 12A may be one or may be three or more.

At assembly of the display device 100 thus configured, the bosses 8A of the back surface plate 8, the opening holes 10A of the printed circuit board 10, and the opening holes 12A of the shield cover 12 are superimposed with each other in the direction Z. Then, the bosses 8A of the back surface plate 8 are inserted into the opening holes 10A of the printed circuit board 10 and the opening holes 12A of the shield cover 12. Each boss 8A is provided with the coupling hole 9A as a screw hole, and the display device 100 is assembled by screwing a screw 14 into the coupling hole 9A of each boss 8A from the surface of the shield cover 12 on the direction Z1 side. In other words, the front case 4, the back surface plate 8, and the shield cover 12 are a housing attached to the printed circuit board 10.

Figure 2:
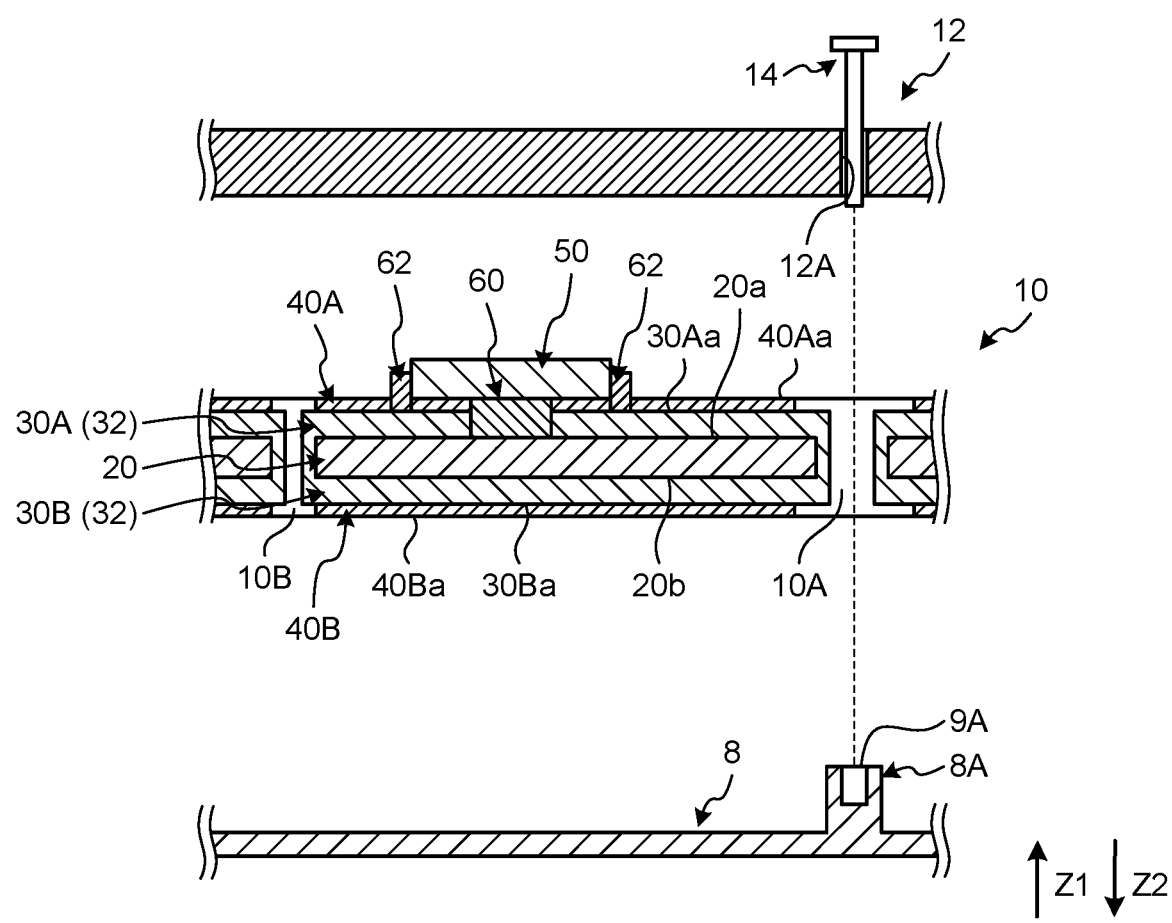
FIG. 2 is a schematic cross-sectional view for describing a laminated structure of a printed circuit board according to the present embodiment.

FIG. 2 is a schematic cross-sectional view for describing a laminated structure of the printed circuit board according to the present embodiment. As illustrated in FIG. 2, the printed circuit board 10 is a multilayered substrate including an insulating layer 20, wiring layers 30A and 30B, and protective layers 40A and 40B. The insulating layer 20 is a substrate made of an insulator and is an insulating member having a plate shape. The insulating layer 20 is made of, for example, a glass epoxy substrate.

The wiring layer 30A is formed of a conductive member. The wiring layer 30A is provided on a surface 20a of the insulating layer 20. The surface 20a is a surface on the direction Z1 side of the insulating layer 20. The wiring layer 30A is formed by patterning a conductive member on the surface 20a of the insulating layer 20. The wiring layer 30A made of the conductive member functions as a wire through which current flows on the printed circuit board 10. In other words, the wiring layer 30A forms a wiring pattern 32 through which current flows on the printed circuit board 10. Similarly, a wiring layer 30B is formed of a conductive member. The wiring layer 30B is provided on a surface 20b of the insulating layer 20. The surface 20b is a surface on the direction Z2 side of the insulating layer 20 and is a surface opposite to the surface 20a. In other words, the wiring layer 30B is provided opposite to the wiring layer 30A through the insulating layer 20 in the direction Z. The wiring layer 30B is formed by patterning a conductive member on the surface 20b of the insulating layer 20. The wiring layer 30B made of the conductive member functions as a wire through which current flows on the printed circuit board 10. In other words, the wiring layer 30B together with the wiring layer 30A forms the wiring pattern 32 through which current flows on the printed circuit board 10. The wiring layers 30A and 30B, in other words, the wiring pattern 32 is made of a metallic member such as copper in the present embodiment.

The protective layer 40A is formed of an insulating member. The protective layer 40A is provided on a surface 30Aa of the wiring layer 30A (wiring pattern 32). The surface 30Aa is a surface on the direction Z1 side of the wiring layer 30A. The protective layer 40A is provided as a resist to protect the wiring layer 30A (wiring pattern 32). The surface 20a of the insulating layer 20 includes a region in which the wiring layer 30A is not provided. The protective layer 40A also covers part of the region in which the wiring layer 30A is not provided and the surface 20a of the insulating layer 20 is exposed. In other words, in the region, the protective layer 40A is provided on the surface 20a of the insulating layer 20. Similarly, a protective layer 40B is formed of an insulating member. The protective layer 40B is provided on a surface 30Ba of the wiring layer 30B (wiring pattern 32). The surface 30Ba is a surface on the direction Z2 side of the wiring layer 30B. The protective layer 40B is provided to protect the wiring layer 30B (wiring pattern 32). The surface 20b of the insulating layer 20 includes a region in which the wiring layer 30B is not provided. The protective layer 40B also covers part of the region in which the wiring layer 30B is not provided and the surface 20b of the insulating layer 20 is exposed. In other words, in the region, the protective layer 40B is provided on the surface 20b of the insulating layer 20. The protective layers 40A and 40B are formed by, for example, patterning. The protective layers 40A and 40B are made of insulating resin in the present embodiment.

As illustrated in FIG. 2, in the printed circuit board 10, the insulating layer 20, the wiring layers 30A and 30B, and the protective layers 40A and 40B are removed in a region in which each opening hole 10A is opened. A region larger than the region in which each opening hole 10A is opened, is removed off the protective layers 40A and 40B. Thus, the wiring layers 30A and 30B, in other words, the wiring pattern 32 is not covered by the protective layers 40A and 40B but is exposed in a region around each opening hole 10A. The wiring layer 30A and the wiring layer 30B are coupled with each other through the inner peripheral surface of each opening hole 10A. In other words, the wiring pattern 32 on the wiring layer 30A side and the wiring pattern 32 on the wiring layer 30B side are electrically coupled with each other through each opening hole 10A.

In addition, the printed circuit board 10 is provided with a plurality of through-holes 10B. Each through-hole 10B penetrates from one surface of the printed circuit board 10 to the other surface. Thus, the insulating layer 20, the wiring layers 30A and 30B, and the protective layers 40A and 40B are removed in a region in which each through-hole 10B is provided. The wiring layer 30A and the wiring layer 30B are coupled with each other through the inner peripheral surface of each through-hole 10B. In other words, the wiring pattern 32 on the wiring layer 30A side and the wiring pattern 32 on the wiring layer 30B side are electrically coupled with each other through each through-hole 10B.

In addition, the printed circuit board 10 is provided with a circuit 50. The circuit 50 is an electronic component mounted on the printed circuit board 10, and transmits various kinds of control signals to the display panel 2 to control display operation of the display panel 2. The circuit 50 is mounted on the surface of the printed circuit board 10 on the direction Z1 side. In the present embodiment, as illustrated in FIG. 2, an insulating part 60 is formed in a region in which the wiring layer 30A is not provided on the surface 20a of the insulating layer 20. The insulating part 60 is provided to have a height same as a surface 40Aa of the protective layer 40A, and the circuit 50 is disposed on the insulating part 60 thus configured. The circuit 50 is electrically coupled with the wiring pattern 32 formed by the wiring layer 30A through a conductive member 62 such as solder. The circuit 50 is an electronic component, and examples of the electronic component include a semiconductor integrated circuit (semiconductor chip), a resistor, and a diode. The circuit 50 as an electronic component is coupled with the wiring layer 30A and the wiring layer 30B.

As described above, the display device 100 is assembled by inserting the bosses 8A of the back surface plate 8 into the opening holes 10A of the printed circuit board 10 and the opening holes 12A of the shield cover 12 and screwing the screws 14 into the coupling holes 9A as the screw holes of the bosses 8A. Thus, in the printed circuit board 10, each screw 14, which is conductive, contacts the shield cover 12 and the corresponding boss 8A of the back surface plate 8. Accordingly, the shield cover 12 and each boss 8A of the back surface plate 8 are electrically coupled with each other through the screw 14. In addition, in the printed circuit board 10, the wiring pattern 32 contacts each boss 8A of the back surface plate 8 around the corresponding opening hole 10A (on the inner peripheral surface of a part at which the opening hole 10A is opened). Accordingly, the wiring pattern 32 and each boss 8A are electrically coupled with each other. When the wiring pattern 32 (the wiring layer 30A and the wiring layer 30B) around each opening hole 10A is referred to as a coupling place, a housing (in this example, the shield cover 12 and the back surface plate 8) and the coupling place contact each other and are electrically coupled. The housing (in this example, the shield cover 12 and the back surface plate 8) is attached to the printed circuit board 10 through each coupling place provided to the wiring pattern 32.

In the printed circuit board 10 having such a laminated structure, the wiring pattern 32 is formed in a shape with which noise current from the housing (in this example, the shield cover 12 and the back surface plate 8) is prevented from reaching the circuit 50. The following describes the shape of the wiring pattern 32.

Figure 3:
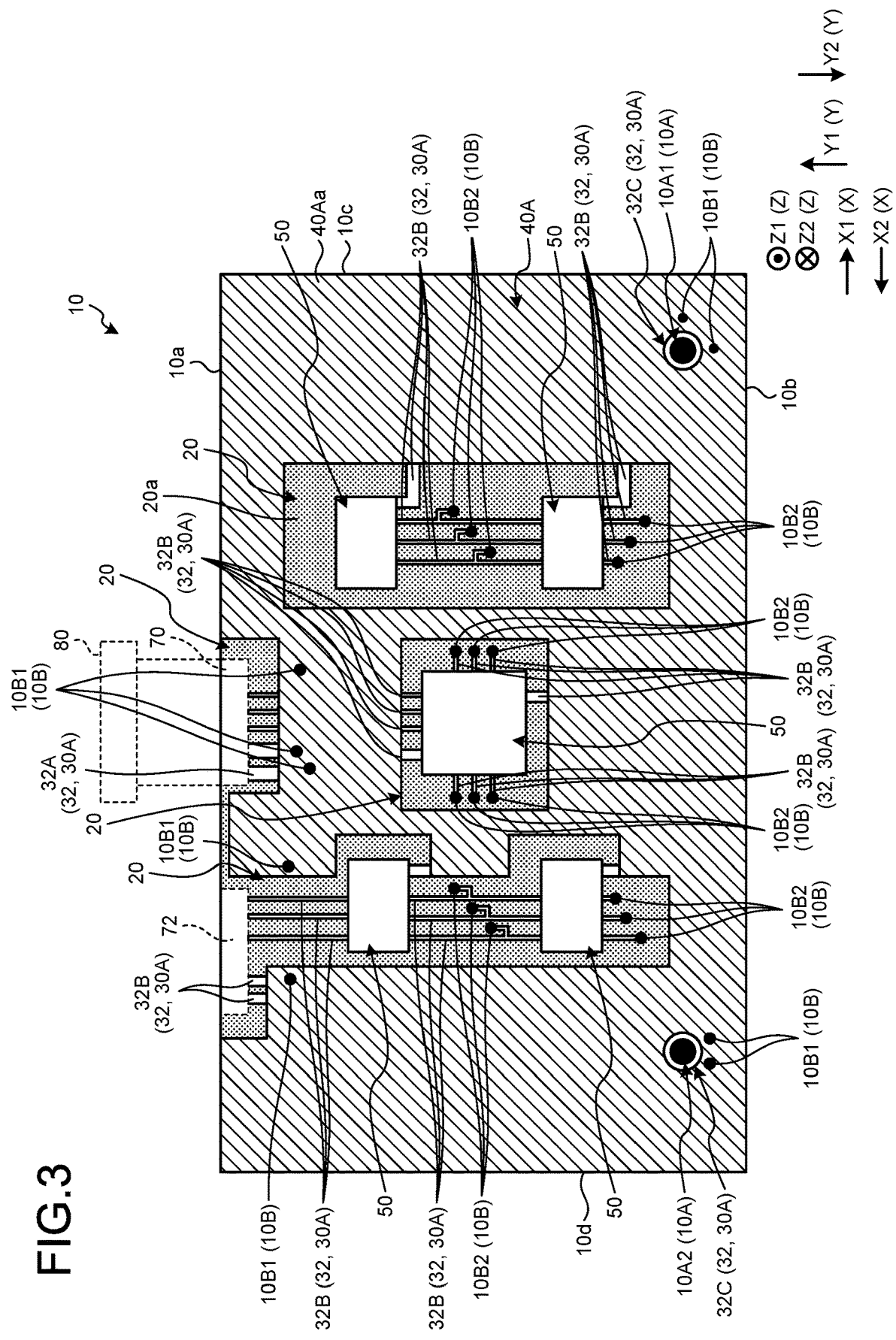
FIG. 3 is a pattern diagram of the printed circuit board according to the present embodiment.

FIG. 3 is a pattern diagram of the printed circuit board according to the present embodiment. FIG. 3 is a diagram of the surface of the printed circuit board 10 on the direction Z1 side when viewed from the direction Z1 side. Hereinafter, a direction X1 is defined to be one direction along the direction X, and a direction X2 is defined to be the other direction along the direction X, in other words, a direction opposite to the direction X1. In addition, a direction Y1 is defined to be one direction along the direction Y, and a direction Y2 is defined to be the other direction along the direction Y, in other words, a direction opposite to the direction Y1. In the present embodiment, the printed circuit board 10 has a rectangular shape when viewed in the direction Z. A first side 10a is defined to be a side thereof on the direction Y1 side, and a second side 10b is defined to be a side facing the first side 10a, in other words, a side on the direction Y2 side. In addition, a third side 10c is defined to be a side of the printed circuit board 10 on the direction X1 side, and a fourth side 10d is defined to be a side facing the third side 10c, in other words, a side on the direction X2 side.

As illustrated in FIG. 3, a plurality of circuits 50 are provided on the surface of the printed circuit board 10 on the direction Z1 side. The number and disposition of the circuits 50 illustrated in FIG. 3 are exemplary, and the circuits 50 may be optionally disposed.

In addition, a ground potential supply terminal 70 and a terminal 72 are provided on the surface of the printed circuit board 10 on the direction Z1 side. The ground potential supply terminal 70 is coupled with an external power source 80. The external power source 80 supplies, for example, actuation electronic power to the display device 100. The external power source 80 is grounded. Thus, the ground potential from the external power source 80 is supplied to the printed circuit board through the ground potential supply terminal 70. The terminal 72 is coupled, for example, with the display panel 2. The terminal 72 is coupled with the other end of the FPC board and coupled with the display panel 2, which is coupled with the one end of the FPC board, through the FPC board. The ground potential supply terminal 70 and the terminal 72 are provided on the first side 10a side on the surface of the printed circuit board 10 on the direction Z1 side. The circuit 50 is provided on the second side 10b side, in other words, the direction Y2 side of the ground potential supply terminal 70 and the terminal 72.

Each opening hole 10A is provided on the second side 10b side. The opening hole 10A is provided on the second side 10b side, in other words, the direction Y2 side of the circuit 50. In other words, the circuit 50 is provided between the ground potential supply terminal 70 and the opening holes 10A in the direction X1 from the first side 10a to the second side 10b. An opening hole 10A1 is defined to be one of the opening holes 10A of the printed circuit board 10, and an opening hole 10A2 is defined to be the other opening hole 10A. The opening hole 10A1 is provided on an end part side of the second side 10b on the direction X1 side, in other words, on the third side 10c side, and the opening hole 10A2 is provided on an end part side of the second side 10b on the direction X2 side, in other words, on the fourth side 10d side. The circuit 50 is provided between the opening hole 10A1 and the opening hole 10A2 in the extend direction of the second side 10b, in other words, the direction X. In other words, the opening holes 10A1 and 10A2 and the ground potential supply terminal 70 are provided outside the circuit 50 when viewed in the direction Z.

In FIG. 3, the hatched part represents the protective layer 40A, and each gray part represents the insulating layer 20. In addition, in FIG. 3, each white part not corresponding to the circuit 50, the ground potential supply terminal 70, nor the terminal 72 represents the wiring pattern 32 of the wiring layer 30A. As illustrated in FIG. 3, the protective layer 40A is not provided in regions in which the ground potential supply terminal 70 and the terminal 72 are provided. Thus, the ground potential supply terminal 70 and the terminal 72 are not covered by the protective layer 40A but are exposed. In addition, part of the wiring pattern 32 serving as a wire coupled with the circuit 50, the ground potential supply terminal 70, and the terminal 72 is not covered by the protective layer 40A but is exposed. In addition, as described with reference to FIG. 2, the protective layer 40A is not provided around each of the opening holes 10A1 and 10A2, in other words, at each coupling place provided to the wiring pattern 32. Thus, the wiring pattern 32 around the opening holes 10A1 and 10A2 is not covered by the protective layer 40A but is exposed. For the purpose of illustration, the circuit 50 is not hatched and thus not provided with the protective layer 40A in FIG. 3, but in reality, the circuit 50 may be provided with the protective layer 40A. In addition, the wiring pattern 32 of the wiring layer 30A may be covered by the protective layer 40A. In other words, no protective layer 40A may be provided at least in a region in which a terminal coupled with the electronic component is provided.

In FIG. 3, the wiring pattern 32 formed by the wiring layer 30A is separately illustrated as a terminal wiring pattern 32A, a circuit wiring pattern 32B, a housing wiring pattern 32C, which will be described later. The circuit wiring pattern 32B is a wire for supplying the ground potential (reference potential) to the electronic component (circuit 50).

In FIG. 3, each through-hole 10B is illustrated as a black part. A plurality of through-holes 10B are provided to the printed circuit board 10. The through-holes 10B includes a through-hole 10B1 grounded, in other words, electrically coupled with the ground potential supply terminal 70, and a through-hole 10B2 not grounded but coupled with the wiring pattern 32 (a circuit wiring pattern 32B3 to be described later) coupled with the circuit 50. The number and positions of the through-holes 10B1 and 10B2 in FIG. 3 are exemplary, and the through-holes 10B1 and 10B2 may be optionally disposed in accordance with a circuit design. For the purpose of illustration, the protective layer 40B is not provided at a place where each through-hole 10B is provided, in other words, the protective layer 40B includes the through-hole 10B in FIG. 3, but in reality, the through-hole 10B is not opened through the protective layer 40B but is covered by the protective layer 40B.

Figure 4:
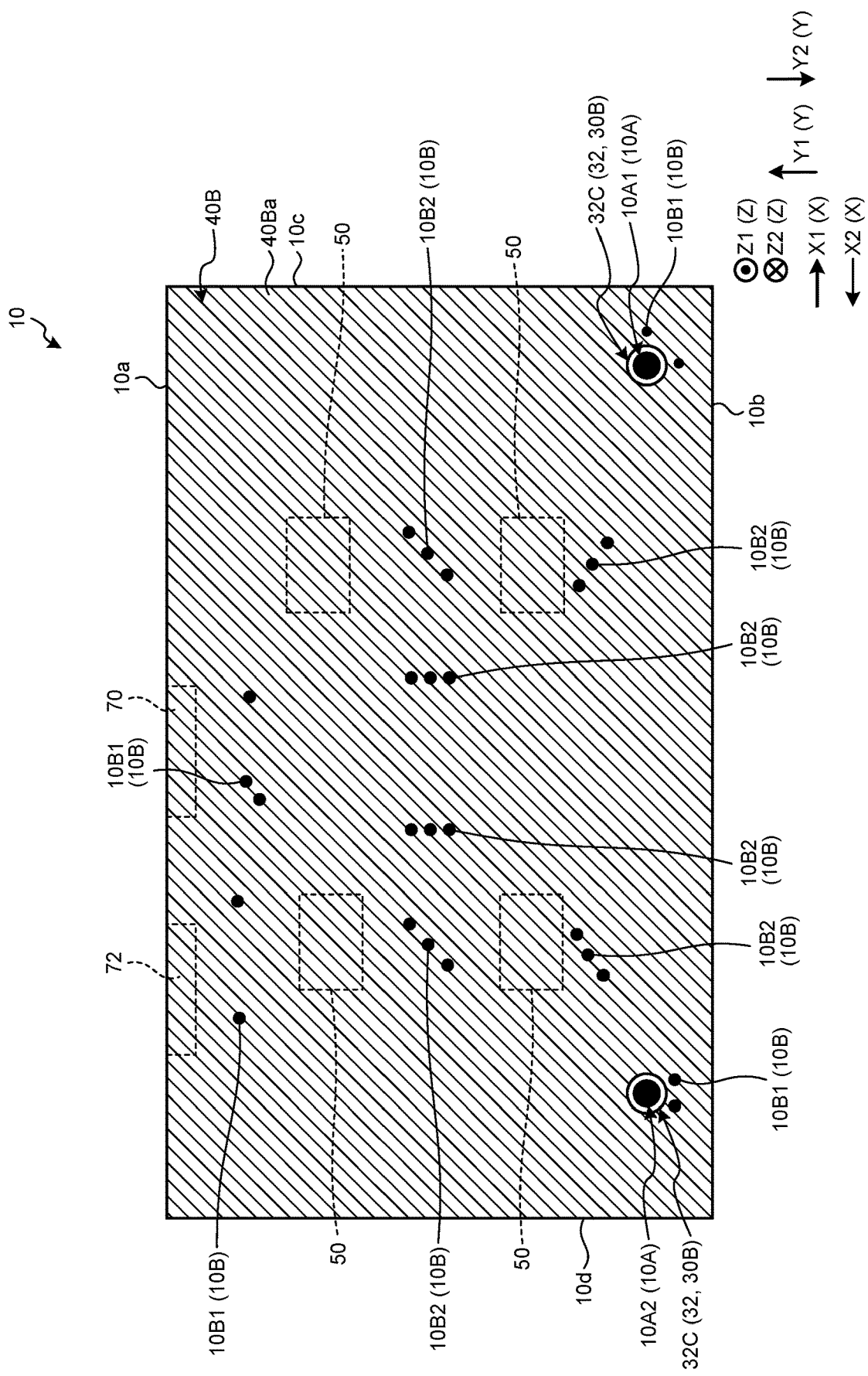
FIG. 4 is a pattern diagram of the printed circuit board according to the present embodiment.

FIG. 4 is a pattern diagram of the printed circuit board according to the present embodiment. For the purpose of illustration, in FIG. 4, the surface of the printed circuit board 10 on the direction Z2 side is projected from the direction Z1 side as the opposite side. In other words, FIG. 4 is a light-transmissive view of the surface of the printed circuit board 10 on the direction Z2 side. Thus, when the surface of the printed circuit board 10 on the direction Z2 side is viewed in the direction Z2, a diagram in which the surface of the printed circuit board 10 on the direction Z2 side in FIG. 4 is inverted in the right-left direction (inverted in the X direction) is obtained. As illustrated in FIG. 4, the coupling places provided to the wiring pattern 32 (wiring layer 30B) around the opening holes 10A1 and 10A2 are not covered by the protective layer 40B but are exposed on the surface of the printed circuit board 10 on the direction Z2 side. The surface of the printed circuit board 10 on the direction Z2 side is provided with the through-hole 10B1 penetrating from the surface thereof on the direction Z1 side. Any region of the surface of the printed circuit board 10 on the direction Z2 side other than the coupling places around the opening holes 10A1 and 10A2 and the through-hole 10B1 is covered by the protective layer 40B.

Figure 5:
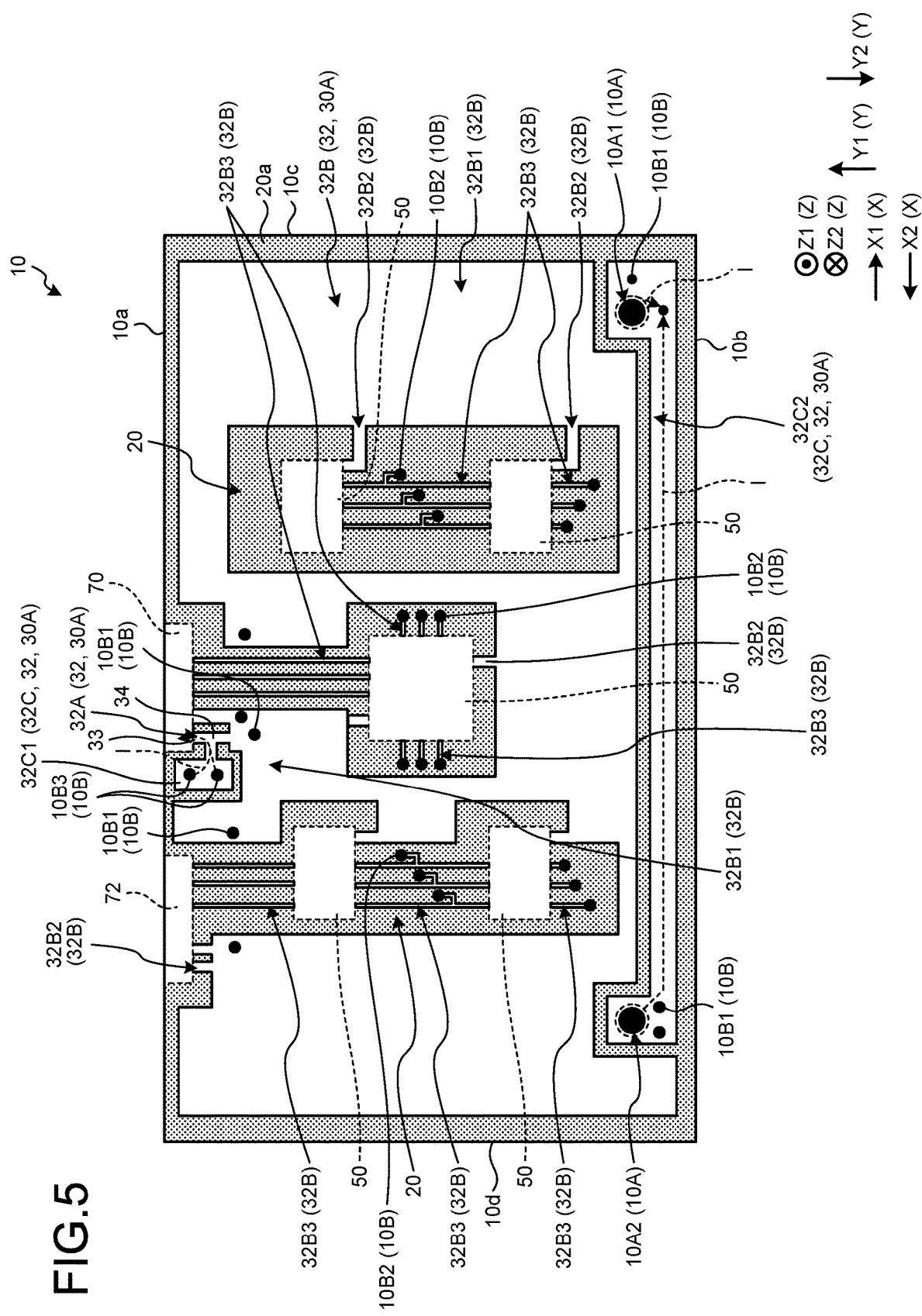
FIG. 5 is a pattern diagram of the printed circuit board according to the present embodiment.

For more detailed description of the wiring pattern 32, the following describes the surfaces of the printed circuit board 10 on the direction Z1 and Z2 sides in the state in which the protective layers 40A and 40B are removed. FIG. 5 is a pattern diagram of the printed circuit board according to the present embodiment. The diagram of FIG. 5 is obtained when the surface of the printed circuit board 10 on the direction Z1 side in the state in which the protective layer 40A is removed is viewed from the direction Z1 side. Thus, the state illustrated in FIG. 3 is obtained when the protective layer 40A is stacked in the state illustrated in FIG. 5.

The insulating layer 20 is provided on the entire surface of the printed circuit board 10 except for places where the opening holes 10A1 and 10A2 and the through-holes 10B are provided, and the wiring layer 30A, in other words, the wiring pattern 32 is provided on the insulating layer 20. In FIG. 5, each white part except for the circuit 50, the ground potential supply terminal 70, and the terminal 72 represents the wiring pattern 32. In FIG. 5, each gray part represents a region in which the wiring pattern 32 is not provided and the insulating layer 20 is exposed. In reality, each gray part in FIG. 5 is covered by the protective layer 40A so that the insulating layer 20 is not actually exposed there, but is a region in which the insulating layer 20 is exposed when the protective layer 40A is removed.

As illustrated in FIG. 5, the wiring pattern 32 includes the terminal wiring pattern 32A, the circuit wiring pattern 32B, and the housing wiring pattern 32C. The terminal wiring pattern 32A is the wiring pattern 32 electrically coupled with the ground potential supply terminal 70. The terminal wiring pattern 32A is provided from a coupling part 33 as one end part to a branch part 34 as the other end part. The coupling part 33 is coupled with the ground potential supply terminal 70. The branch part 34 is coupled with the circuit wiring pattern 32B and the housing wiring pattern 32C. Accordingly, the terminal wiring pattern 32A is electrically coupled with the ground potential supply terminal 70 through the coupling part 33 and electrically coupled with each of the circuit wiring pattern 32B and the housing wiring pattern 32C through the branch part 34.

The branch part 34 is preferably provided near the ground potential supply terminal 70. Specifically, the branch part 34 is preferably provided at a position closer to the ground potential supply terminal 70 than the circuit 50. Accordingly, the branch part 34 is provided at a position closer to the ground potential supply terminal 70 than the circuit 50 nearest to the ground potential supply terminal 70. In other words, when viewed in the Z direction, the shortest distance between the ground potential supply terminal 70 and the branch part 34 is shorter than the shortest distance between the circuit 50 and the ground potential supply terminal 70. Thus, the circuit 50 is not provided between the branch part 34 and the ground potential supply terminal 70.

The housing wiring pattern 32C is branched from the branch part 34 of the terminal wiring pattern 32A and electrically coupled with the coupling places around the opening holes 10A1 and 10A2. The housing wiring pattern 32C is not electrically coupled with the circuit wiring pattern 32B at any place other than the branch part 34. Specifically, the housing wiring pattern 32C includes a housing wiring pattern 32C1, a housing wiring pattern 32C2, and a housing wiring pattern 32C3 (refer to FIG. 6). The housing wiring pattern 32C3 will be described later with reference to FIG. 6.

As illustrated in FIG. 5, the housing wiring pattern 32C1 is provided on the surface of the printed circuit board 10 on the direction Z1 side, in other words, the surface 20a of the insulating layer 20. The housing wiring pattern 32C1 is coupled with the branch part 34 of the terminal wiring pattern 32A. A through-hole 10B3 is provided in a region in which the housing wiring pattern 32C1 is provided. The through-hole 10B3 penetrates from the surface of the printed circuit board 10 on the direction Z1 side to the surface of the printed circuit board 10 on the direction Z2 side. The housing wiring pattern 32C1 is not coupled with the circuit wiring pattern 32B at any place other than a place coupled with the branch part 34. In other words, the housing wiring pattern 32C1 is not coupled with any other wiring pattern 32 at an outer periphery other than the place coupled with the branch part 34 when viewed from the direction Z in the state in which the protective layer 40A is removed, and the outer periphery other than the place coupled with the branch part 34 is surrounded by the insulating layer 20.

The shape of the housing wiring pattern 32C1 extends from the place coupled with the branch part 34 at a small width (area) and has a large width (area) at a position where the through-hole 10B3 is provided. The housing wiring pattern 32C1 is provided between the ground potential supply terminal 70 and the terminal 72. Similarly to the branch part 34, the housing wiring pattern 32C1 is preferably provided at a position closer to the ground potential supply terminal 70 than the circuit 50. In other words, the shortest distance between the ground potential supply terminal 70 and the housing wiring pattern 32C1 is preferably shorter than the shortest distance between the circuit 50 and the ground potential supply terminal 70. In addition, the circuit 50 is preferably not provided between the housing wiring pattern 32C1 and the ground potential supply terminal 70. However, the shape of the housing wiring pattern 32C1 is not limited to that described.

The housing wiring pattern 32C2 is provided on the surface of the printed circuit board 10 on the direction Z1 side, in other words, the surface 20a of the insulating layer 20. The housing wiring pattern 32C2 is provided around the opening holes 10A on the surface 20a of the insulating layer 20. In other words, the housing wiring pattern 32C2 forms the coupling places around the opening holes 10A on the surface of the printed circuit board 10 on the direction Z1 side and is electrically coupled with a housing (in this example, the shield cover 12). More specifically, the housing wiring pattern 32C2 is provided from the coupling place (region surrounded by a dashed line in FIG. 5) around the opening hole 10A1 to the coupling place (region surrounded by a dashed line in FIG. 5) around the opening hole 10A2. In other words, the housing wiring pattern 32C2 electrically couples the coupling place around the opening hole 10A1 and the coupling place around the opening hole 10A2.

The through-hole 10B1 is provided in a region in which the housing wiring pattern 32C2 is provided. Thus, the housing wiring pattern 32C2 is electrically coupled with the through-hole 10B1. In the example illustrated in FIG. 5, the through-hole 10B1 is provided near the opening holes 10A1 and 10A2, but the present disclosure is not limited thereto, and the through-hole 10B1 may be provided at an optional position in the region in which the housing wiring pattern 32C2 is provided. The housing wiring pattern 32C2 is electrically coupled with the branch part 34 through the through-hole 10B1. The housing wiring pattern 32C2 is not electrically coupled with the circuit wiring pattern 32B. The housing wiring pattern 32C2 is not coupled with the wiring pattern 32 at an outer periphery when viewed from the direction Z in the state in which the protective layer 40A is removed. The housing wiring pattern 32C2 extends along the second side 10b from the coupling place around the opening hole 10A1 to the coupling place around the opening hole 10A2. In other words, the housing wiring pattern 32C2 is provided on the second side 10b side, and more specifically, the housing wiring pattern 32C2 is provided on the second side 10b side (direction Y2 side) of the circuit 50 and the circuit wiring pattern 32B. However, the housing wiring pattern 32C2 only needs to be electrically coupled with a housing (in this example, the shield cover 12) and electrically uncoupled with the circuit wiring pattern 32B at any place other than the through-hole 10B1 and may have an optional shape.

The circuit wiring pattern 32B is branched from the branch part 34 of the terminal wiring pattern 32A and electrically coupled with the circuit 50. The circuit wiring pattern 32B is not electrically coupled with the housing wiring pattern 32C at any place other than the branch part 34. The circuit wiring pattern 32B includes a circuit wiring pattern 32B1, a circuit wiring pattern 32B2, and the circuit wiring pattern 32B3.

The circuit wiring pattern 32B1 is provided across the entire range of a region inside an outer edge part of the insulating layer 20 except for regions around the circuit 50, the ground potential supply terminal 70, and the terminal 72, and the housing wiring pattern 32C on the surface of the printed circuit board 10 on the direction Z1 side, in other words, on the surface 20a of the insulating layer 20. Part of the circuit wiring pattern 32B1 provided near the ground potential supply terminal 70 is coupled with the branch part 34 of the terminal wiring pattern 32A.

The circuit wiring pattern 32B2 is provided to electrically couple the circuit 50 and the circuit wiring pattern 32B1 on the surface of the printed circuit board 10 on the direction Z1 side, in other words, on the surface 20a of the insulating layer 20. The circuit wiring pattern 32B2 has one end part coupled with the circuit 50 and the other end part coupled with the circuit wiring pattern 32B1. The circuit wiring pattern 32B2 is provided for ground potential supply to the circuit 50 and thus provided for each circuit 50.

The circuit wiring pattern 32B3 is provided to electrically couple the circuits 50, each circuit 50 and the ground potential supply terminal 70, and each circuit 50 and the terminal 72 on the surface of the printed circuit board 10 on the direction Z1 side, in other words, on the surface 20a of the insulating layer 20. The circuit wiring pattern 32B3 is provided for flow of a control signal to the display panel 2 therethrough and electrically uncoupled with the terminal wiring pattern 32A, the housing wiring pattern 32C, the circuit wiring pattern 32B1, and the circuit wiring pattern 32B2. The circuit wiring pattern 32B3 is electrically coupled with the through-hole 10B2.

The wiring pattern 32 on the surface of the printed circuit board 10 on the direction Z1 side has the above-described configuration.

Figure 6:
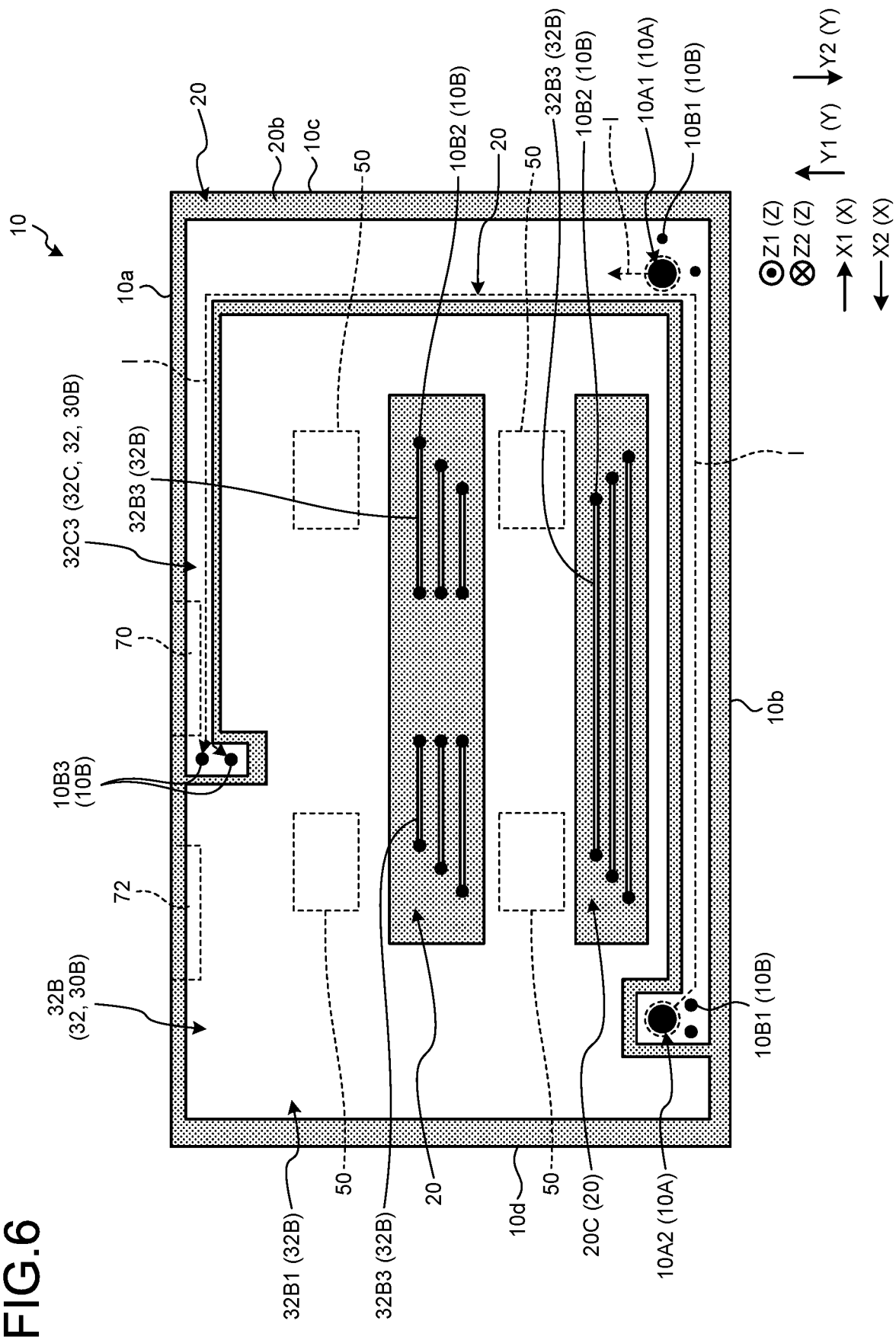
FIG. 6 is a pattern diagram of the printed circuit board according to the present embodiment.

FIG. 6 is a pattern diagram of the printed circuit board according to the present embodiment. In FIG. 6, the surface of the printed circuit board 10 on the direction Z2 side in the state in which the protective layer 40B is removed is projected from the direction Z1 side as the opposite side. As illustrated in FIG. 6, the housing wiring pattern 32C3 is provided on the surface of the printed circuit board 10 on the direction Z2 side, in other words, on the surface 20b of the insulating layer 20. The housing wiring pattern 32C3 is provided around the opening holes 10A on the surface 20b of the insulating layer 20. In other words, the housing wiring pattern 32C3 forms the coupling places around the opening holes 10A on the surface of the printed circuit board 10 on the direction Z2 side and is electrically coupled with a housing (in this example, the back surface plate 8).

The through-holes 10B1 (in the present embodiment, the through-holes 10B1 near the opening holes 10A) electrically coupled with the housing wiring pattern 32C2 are provided in a region in which the housing wiring pattern 32C3 is provided, and the housing wiring pattern 32C3 is electrically coupled with these through-holes 10B1. Accordingly, the housing wiring pattern 32C2 and the housing wiring pattern 32C3 are electrically coupled with each other through the through-holes 10B1. In addition, the through-holes 10B3 are provided in the region in which the housing wiring pattern 32C3 is provided, and the housing wiring pattern 32C3 is electrically coupled with the through-holes 10B3. The through-holes 10B3 are electrically coupled with the housing wiring pattern 32C1 on the surface of the printed circuit board 10 on the direction Z1 side (refer to FIG. 5). Accordingly, the housing wiring pattern 32C3 and the housing wiring pattern 32C1 are electrically coupled with each other through the through-holes 10B3.

The housing wiring pattern 32C3 is provided from places where the through-holes 10B3 are provided to the coupling place around the opening hole 10A2 (region surrounded by a dashed line in FIG. 5) through the coupling place around the opening hole 10A1 (region surrounded by a dashed line in FIG. 5). Accordingly, the housing wiring pattern 32C3 electrically couples the through-hole 10B3, the coupling place around the opening hole 10A1, the coupling place around the opening hole 10A2, and the through-holes 10B1 electrically coupled with the housing wiring pattern 32C2.

The housing wiring pattern 32C3 is coupled with the branch part 34 through the through-holes 10B3. The housing wiring pattern 32C3 is not coupled with the circuit wiring pattern 32B at any place other than the through-holes 10B3, in other words, at any place other than the branch part 34. The housing wiring pattern 32C3 is not coupled with the wiring pattern 32 at an outer periphery when viewed from the direction Z in the state in which the protective layer 40B is removed. The housing wiring pattern 32C3 extends along the second side 10b from the coupling place around the opening hole 10A2 to the coupling place around the opening hole 10A1, and extends along the third side 10c and the first side 10a from the coupling place around the opening hole 10A1 to the places where the through-holes 10B3 are provided. In other words, the housing wiring pattern 32C3 is provided outside the circuit 50 and the circuit wiring pattern 32B when viewed in the direction Z. However, the housing wiring pattern 32C2 only needs to be electrically coupled with a housing (in this example, the back surface plate 8) and the housing wiring patterns 32C1 and 32C3 and electrically uncoupled with the circuit wiring pattern 32B at any place other than the through-holes 10B3 and may have an optional shape.

In this manner, the housing wiring pattern 32C1, the housing wiring pattern 32C2, and the housing wiring pattern 32C3 are electrically coupled with one another through the through-holes 10B1 and 10B3. Accordingly, the housing wiring pattern 32C is provided across a plurality of layers of the printed circuit board 10. More specifically, in the housing wiring pattern 32C, a pattern (the housing wiring patterns 32C1 and 32C2) provided to a first layer on the surface of the printed circuit board 10 on the direction Z1 side and a pattern (the housing wiring pattern 32C3) provided to a second layer on the surface of the printed circuit board 10 on the direction Z2 side are electrically coupled with each other through the through-holes 10B1 and 10B3.

The circuit wiring pattern 32B1 is provided in the outer edge part of the insulating layer 20 and a region inside the housing wiring pattern 32C3 on the surface of the printed circuit board 10 on the direction Z2 side, in other words, on the surface 20b of the insulating layer 20. In addition, the through-holes 10B2 and the circuit wiring pattern 32B3 coupling the through-holes 10B2 are provided in a region (two rectangular regions in the example illustrated in FIG. 6) inside the circuit wiring pattern 32B1 in which the circuit wiring pattern 32B1 is not provided.

Figure 7:
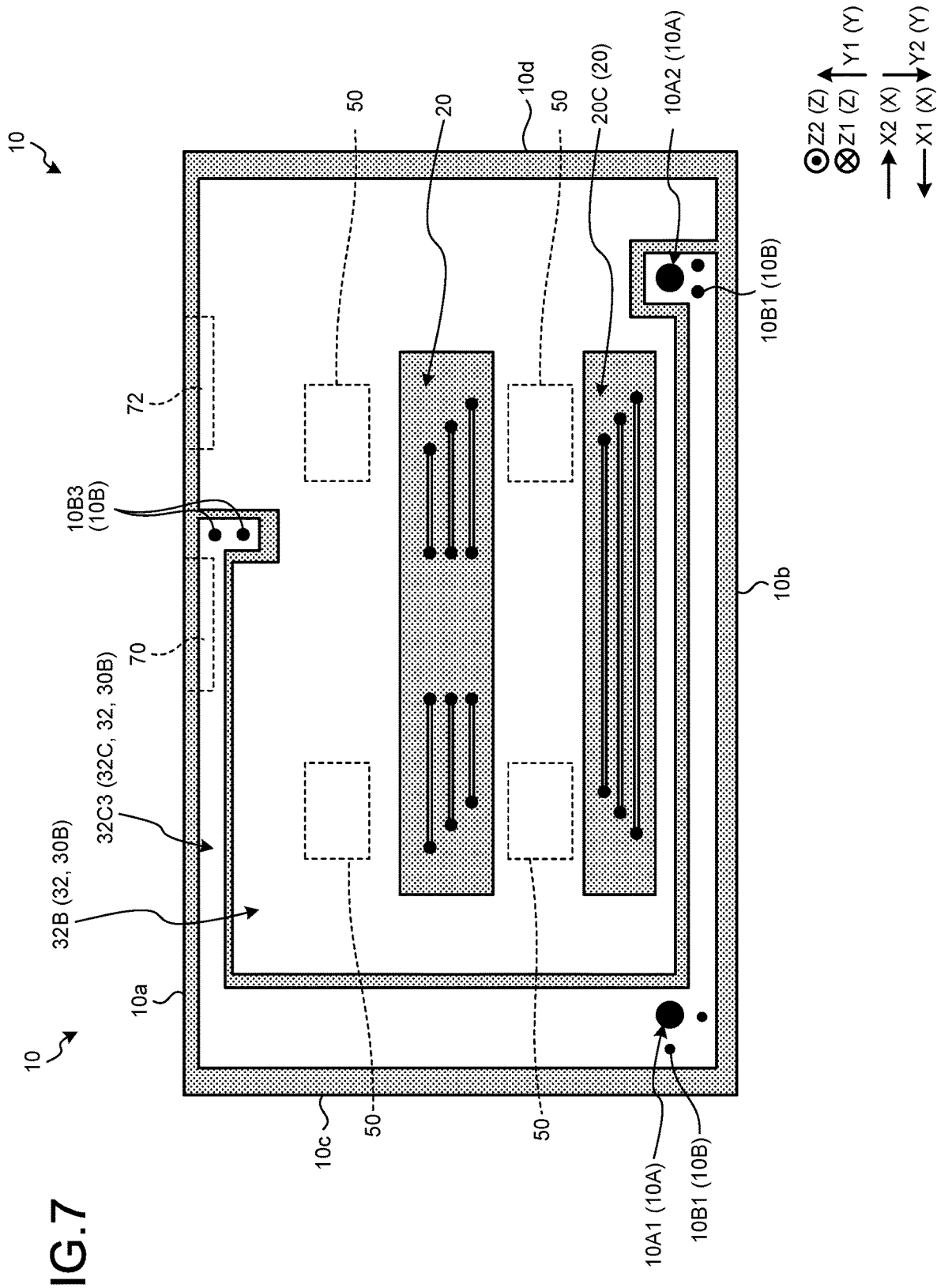
FIG. 7 is a pattern diagram of the printed circuit board according to the present embodiment.

The wiring pattern 32 on the surface of the printed circuit board 10 on the direction Z2 side has the above-described configuration. FIG. 7 is a pattern diagram of the printed circuit board according to the present embodiment. In FIG. 7, the surface of the printed circuit board 10 on the direction Z2 side is viewed in the state in which the protective layer 40B is removed like in FIG. 6, but is viewed from the direction Z2 unlike in FIG. 6. Thus, FIG. 7 is a diagram obtained when the surface of the printed circuit board 10 on the direction Z2 side in FIG. 6 is inverted in the right-left direction (inverted in the direction X).

When coupled with the circuit 50 and the ground potential supply terminal 70, the wiring pattern 32 supplies the ground potential to the circuit 50, in other words, grounds the circuit 50 to remove unnecessary radiation radio wave, in other words, unnecessary voltage at the circuit 50. The wiring pattern 32 contacts a conductive housing such as the shield cover 12 or the back surface plate 8 at a contact place. The conductive housing such as the shield cover 12 or the back surface plate 8 prevents external discharge of noise in the circuit 50 but is electrically charged through reception of noise from the outside, in other words, electromagnetic wave from the outside in some cases. In such a case, current potentially flows from each housing to the circuit 50 in the printed circuit board 10 through the wiring pattern 32 contacting the housing. The current to the circuit 50 is different from a signal for controlling the display panel 2, and thus the circuit 50 potentially malfunctions due to the current from the housing, causing operation defect.

In contrast, in the printed circuit board 10 according to the present embodiment, the terminal wiring pattern 32A, the circuit wiring pattern 32B, and the housing wiring pattern 32C are provided as the wiring pattern 32. In the present embodiment, the terminal wiring pattern 32A coupled with the ground potential supply terminal 70 and the circuit wiring pattern 32B coupled with the circuit 50 are coupled with each other through the branch part 34 so that the ground potential is appropriately supplied to the circuit 50. In addition, the housing wiring pattern 32C contacting the housing and the terminal wiring pattern 32A are coupled with each other through the branch part 34, and the housing wiring pattern 32C and the circuit wiring pattern 32B are not coupled with each other at any place other than the branch part 34. With this configuration, current from the housing can flow to the ground potential supply terminal 70 through the housing wiring pattern 32C, the branch part 34, and the terminal wiring pattern 32A and can be prevented from flowing from the housing wiring pattern 32C to the circuit 50 through the circuit wiring pattern 32B. In other words, in the present embodiment, since single-point grounding is achieved through the branch part 34, the current from the housing is prevented from flowing to the circuit 50, thereby preventing malfunction of the circuit 50.

More specifically, as illustrated in FIG. 5, Current I from a housing (in this example, the shield cover 12) flows through the housing wiring pattern 32C2 from the coupling places around the opening holes 10A1 and 10A2 in contact with the housing on the surface of the printed circuit board 10 on the direction Z1 side. Having flowed through the housing wiring pattern 32C2, Current I flows to the housing wiring pattern 32C3 on the surface of the printed circuit board 10 on the direction Z2 side through the through-hole 10B1 (refer to FIG. 6). Current I flowing through the housing wiring pattern 32C3 flows to the housing wiring pattern 32C1 through the through-hole 10B3 in the housing wiring pattern 32C3 (refer to FIG. 5). Having flowed through the housing wiring pattern 32C1, Current I flows from the terminal wiring pattern 32A to the ground potential supply terminal 70 and then to the external power source 80 through the branch part 34. In addition, Current I from the housing (in this example, the back surface plate 8) flows through the housing wiring pattern 32C3 from the coupling places around the opening holes 10A1 and 10A2 contacting the housing on the surface of the printed circuit board 10 on the direction Z2 side (refer to FIG. 6), and flows through the through-hole 10B3, the housing wiring pattern 32C1, the branch part 34, and the terminal wiring pattern 32A to the ground potential supply terminal 70 and then to the external power source 80. In this manner, since the path of Current I from the housing flowing through the housing wiring pattern 32C is uncoupled with the circuit wiring pattern 32B coupled with the circuit 50 up to the branch part 34, Current I is prevented from flowing to the circuit 50.

Figure 8:
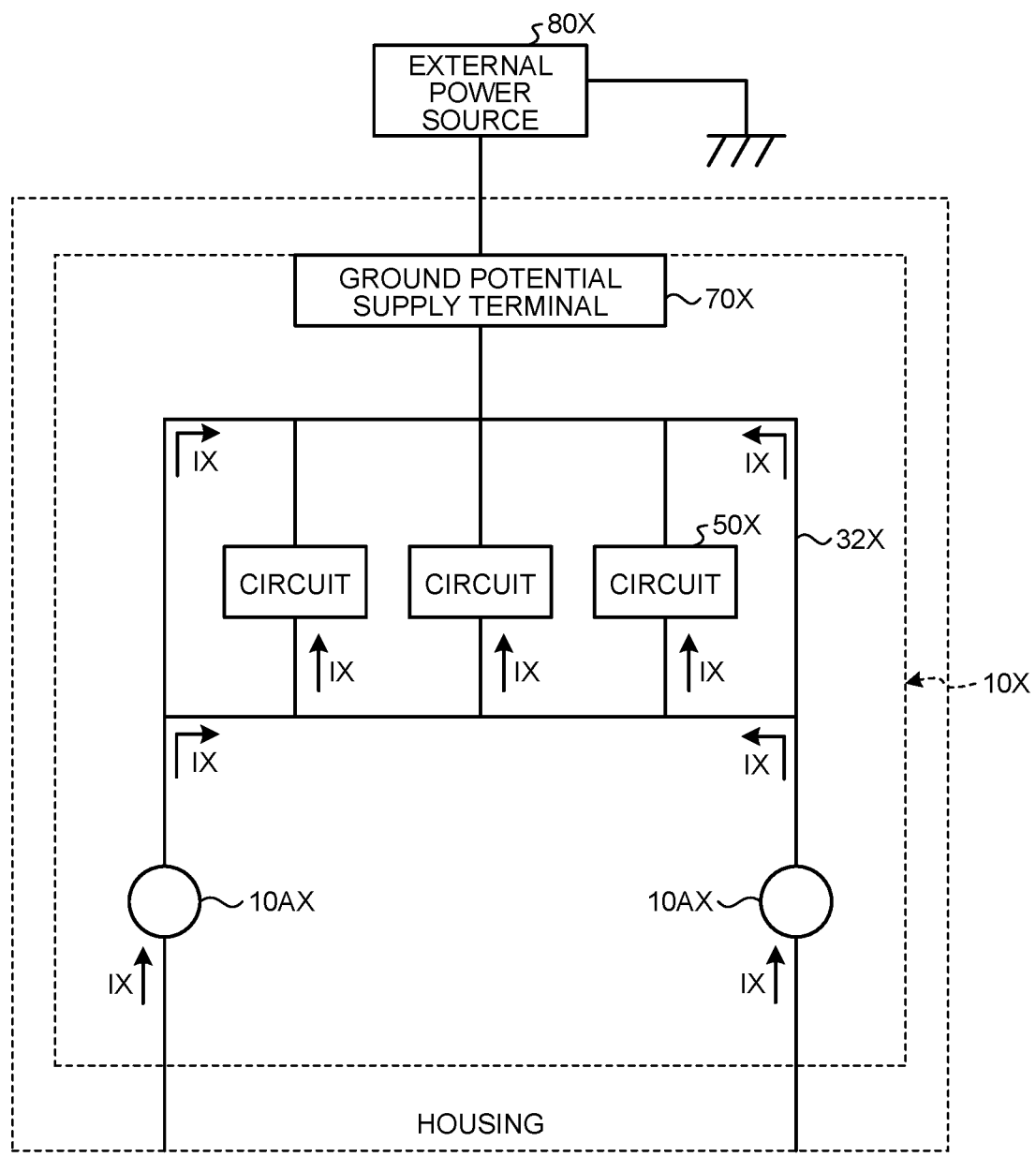
FIG. 8 is an equivalent circuit diagram according to a comparative example.

The flow of Current I is described below with reference to an equivalent circuit diagram. FIG. 8 is an equivalent circuit diagram according to a comparative example. In the example illustrated in FIG. 8, a printed circuit board 10X is provided with coupling places around opening holes 10AX, a wiring pattern 32X, circuits 50X, and a ground potential supply terminal 70X coupled with an external power source 80X. In FIG. 8, the coupling places around the opening holes 10AX are in contact with a housing and coupled with the housing. The wiring pattern 32X does not has a single-point grounding configuration in which the wiring pattern 32X is coupled with each circuit 50X only through the branch part 34, but has a configuration in which the wiring pattern 32X is coupled with each circuit 50X also at places other than the branch part 34. Thus, Current IX from the housing is supplied to each circuit 50X and flows through the circuit 50.

Figure 9:
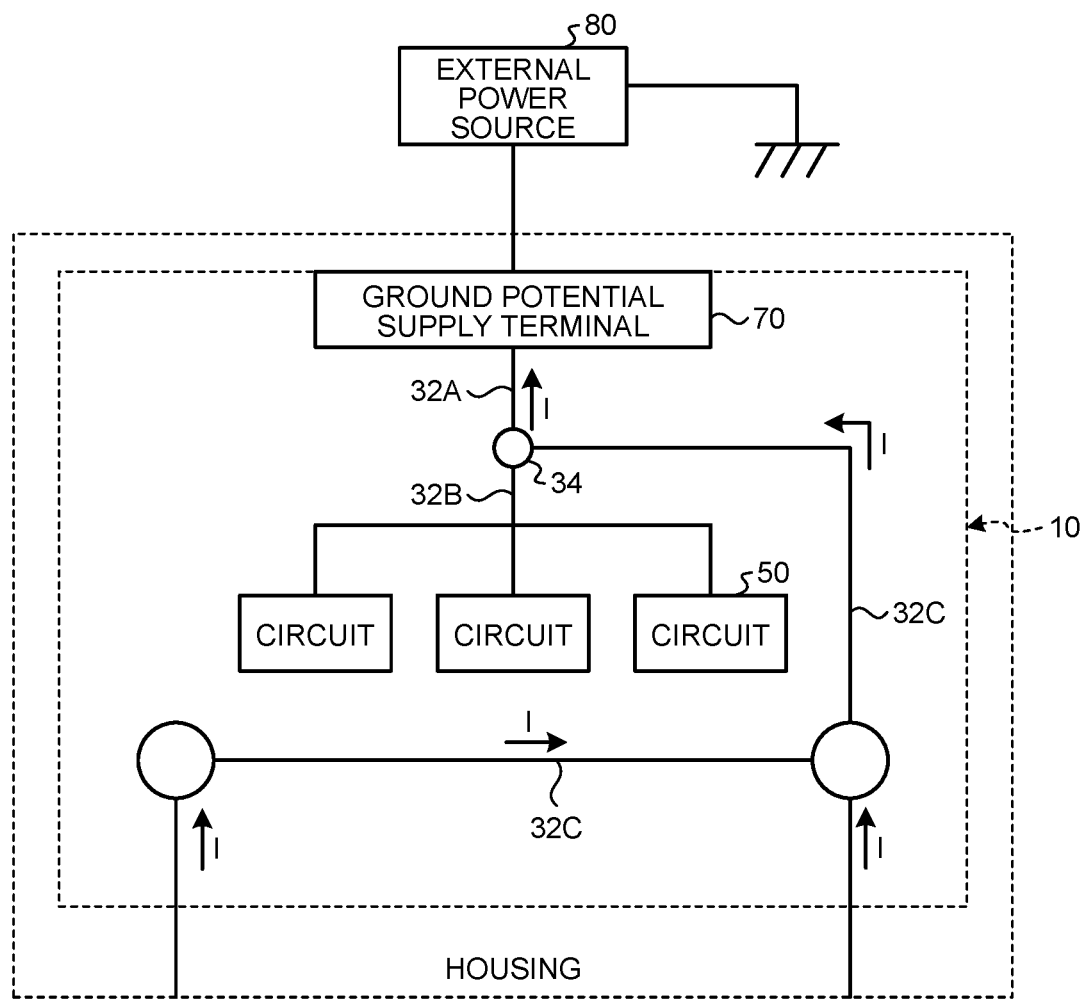
FIG. 9 is an equivalent circuit diagram according to the present embodiment.

FIG. 9 is an equivalent circuit diagram according to the present embodiment. As illustrated in FIG. 9, in the present embodiment, the housing wiring pattern 32C is coupled with the circuit wiring pattern 32B only through the branch part 34, Current I from a housing flows from the ground potential supply terminal 70 to the external power source 80 through the terminal wiring pattern 32A, and thus can be prevented from flowing to each circuit 50. In addition, since the branch part 34 is provided in the printed circuit board 10, increase in the number of external terminals can be avoided.

As described above, the display device 100 according to the present embodiment includes the display panel 2, the printed circuit board 10, and a housing (in this example, the shield cover 12 and the back surface plate 8). The printed circuit board 10 is attached to the display panel 2 and includes the ground potential supply terminal 70, the circuit 50, and the wiring pattern 32 electrically coupling the ground potential supply terminal 70 and the circuit 50. The housing contacts a coupling place provided to the wiring pattern 32 and is attached to the printed circuit board 10 through the coupling place. The wiring pattern 32 includes the terminal wiring pattern 32A electrically coupled with the ground potential supply terminal 70, the circuit wiring pattern 32B branched from the branch part 34 at a predetermined position on the terminal wiring pattern 32A and electrically coupled with the circuit 50, and the housing wiring pattern 32C branched from the branch part 34 of the terminal wiring pattern 32A and electrically coupled with the coupling place. The circuit wiring pattern 32B and the housing wiring pattern 32C are electrically uncoupled with each other at any place other than the branch part 34. In the display device 100 thus configured, since single-point grounding is achieved through the branch part 34, current from the housing can be prevented from flowing to the circuit 50, thereby preventing operation defect.

The ground potential supply terminal 70 is coupled with the external power source 80, and the ground potential from the external power source 80 is supplied to the printed circuit board 10 through the ground potential supply terminal 70. In the display device 100 thus configured, since single-point grounding is achieved with the ground potential supply terminal 70 through which the ground potential is supplied, current from the housing can be prevented from flowing to the circuit 50, thereby preventing operation defect.

The branch part 34 is provided at a position closer to the ground potential supply terminal 70 than the circuit 50. In the display device 100 thus configured, since the branch part 34 is provided near the ground potential supply terminal 70, current from the housing can be more easily caused to flow toward the ground potential supply terminal 70 side. Thus, current from the housing can be more excellently prevented from flowing to the circuit 50, thereby preventing operation defect.

The printed circuit board 10 is a multilayered substrate, and the housing wiring pattern 32C is provided across a plurality of layers of the printed circuit board 10. In the display device 100 thus configured, since the housing wiring pattern 32C is provided across the plurality of layers, the flow path of current from the housing can be restricted to prevent the current from the housing from flowing to the circuit 50 even when the housing contacts any layer.

The printed circuit board 10 includes the first layer on a surface on a side where the ground potential supply terminal 70 is provided, in other words, a surface on the direction Z1 side, and the second layer on a surface on a side opposite to the first layer, in other words, a surface on the direction Z2 side. In the housing wiring pattern 32C, a pattern (the housing wiring patterns 32C1 and 32C2) provided to the first layer and a pattern (the housing wiring pattern 32C3) provided to the second layer are electrically coupled with each other through the through-holes 10B1 and 10B3. In the display device 100 thus configured, the flow path of current from the housing can be restricted to prevent the current from the housing from flowing to the circuit 50 when the housing contacts any of both surfaces.

The ground potential supply terminal 70 is provided on the first side 10a side of the printed circuit board 10, and the opening hole 10A (or the coupling place) is provided on the second side 10b side of the printed circuit board 10. The circuit 50 is provided between the ground potential supply terminal 70 and the opening hole 10A (or the coupling place) in the direction X from the first side 10a to the second side 10b. In the display device 100 thus configured, since the circuit 50 is disposed on the inner side, current from the housing can be excellently prevented from flowing to the circuit 50.

The opening hole 10A (or the coupling place) is provided at least each of one end part side of the second side 10b and the other end part side. In the display device 100 thus configured, since the circuit 50 is disposed on the inner side, current from the housing can be excellently prevented from flowing to the circuit 50.

It should be understood that the present disclosure includes any other effect achieved by aspects described in the present embodiment, which is clear from description of the present specification or which could be thought of by the skilled person in the art as appropriate.

What is claimed is:

1. A display device comprising:
   a display panel;
   a printed circuit board attached to the display panel and including a ground potential supply terminal, a circuit, and a wiring pattern electrically coupling the ground potential supply terminal and the circuit; and
   a housing that contacts a coupling place provided to the wiring pattern and is attached to the printed circuit board through the coupling place, wherein
   the wiring pattern includes:
   a terminal wiring pattern electrically coupled with the ground potential supply terminal;
   a circuit wiring pattern branched from a branch part at a predetermined position on the terminal wiring pattern and electrically coupled with the circuit; and
   a housing wiring pattern branched from the branch part of the terminal wiring pattern and electrically coupled with the coupling place, and
   the circuit wiring pattern and the housing wiring pattern are uncoupled with each other at any place other than the branch part.

2. The display device according to claim 1, wherein the ground potential supply terminal is coupled with an external power source, and ground potential from the external power source is supplied to the printed circuit board through the ground potential supply terminal.

3. The display device according to claim 1, wherein the branch part is provided at a position closer to the ground potential supply terminal than the circuit.

4. The display device according to claim 1, wherein the printed circuit board is a multilayered substrate, and the housing wiring pattern is provided across a plurality of layers of the printed circuit board.

5. The display device according to claim 4, wherein
   the printed circuit board includes a first layer on a surface on a side where the ground potential supply terminal is provided, and a second layer on a surface on a side opposite to the first layer, and
   in the housing wiring pattern, a pattern provided to the first layer and a pattern provided to the second layer are electrically coupled with each other through a through-hole.

6. The display device according to claim 1, wherein the ground potential supply terminal is provided on a side closer to a first side of the printed circuit board, the coupling place is provided on a side closer to a second side facing the first side of the printed circuit board, and the circuit is provided between the ground potential supply terminal and the coupling place in a direction from the first side to the second side.

7. The display device according to claim 6, wherein the coupling place is provided on at least each of one end part side of the second side and the other end part side.

* * * * *